United States Patent [19]
Izumisawa

[11] 3,917,977
[45] Nov. 4, 1975

[54] VERTICAL DEFLECTION CIRCUITS FOR ELECTRON BEAM SCANNING

[75] Inventor: Masato Izumisawa, Yokosuka, Japan

[73] Assignee: Sony Corporation, Tokyo, Japan

[22] Filed: Dec. 26, 1973

[21] Appl. No.: 427,649

[30] Foreign Application Priority Data

Dec. 28, 1972 Japan .................................. 48-1722

[52] U.S. Cl. .................................. 315/395; 315/408
[51] Int. Cl.² ...................... H01J 29/70; H01J 29/72
[58] Field of Search ............................. 315/395, 408

[56] References Cited

UNITED STATES PATENTS 3,483,425 12/1969 Yanishevsky ...................... 315/395

*Primary Examiner*—Maynard R. Wilbur
*Assistant Examiner*—Richard E. Berger
*Attorney, Agent, or Firm*—Hill, Gross, Simpson, Van Santen, Steadman, Chiara & Simpson

[57] ABSTRACT

A vertical deflection circuit which has an output stage formed as a single-ended push-pull amplifier connected to a first voltage source through a unidirectional element and also connected through a switch device to a second voltage source supplying a voltage with an absolute value larger than the absolute value of the voltage of the first voltage source. The switch device is controlled to have the conductive state only in the retrace period and the output stage is supplied with the voltage of the first voltage source in the trace period and with the voltage of the second voltage source in the retrace period, whereby the output efficiency of the circuit is increased.

9 Claims, 13 Drawing Figures

VERTICAL DEFLECTION CIRCUITS FOR ELECTRON BEAM SCANNING

BACKGROUND OF THE INVENTION

1. Field of the Invention

This invention relates generally to electron beam deflection circuits for vertical scanning, and more particularly is directed to an improvement in vertical electron beam deflection circuits having an output stage formed in the type of single-ended push-pull amplifier.

2. Description of the Prior Art

In television receivers and other apparatus utilizing cathode ray image reproducing devices, vertical and horizontal deflection circuits are provided for field and line scannings of electron beams, respectively. There has been proposed various kinds of vertical deflection circuits. One of such a vertical deflection circuit, which is often employed because of its increased efficiency, is a transistorized circuit having an output stage, which supplies a sawtooth wave current to a vertical deflection winding, formed in a type of single-ended push-pull amplifier. However, previously proposed vertical deflection circuits having the output stage of the single-ended push-pull amplifier type spend useless power which is essentially caused by their circuit construction. For this reason, the efficiency, that is, the ratio of the output power at the vertical deflection winding to the power supplied to the circuit, is not increased very much.

SUMMARY OF THE INVENTION

The present invention provides an improved vertical deflection circuit having an output stage of single-ended push-pull amplifier type.

The present invention further provides a novel vertical deflection circuit having an output stage of single-ended push-pull amplifier type which operates with increased efficiency.

The present invention still further provides a novel vertical deflection circuit having an output stage of the single-ended push-pull amplifier type which uses different power source voltages in trace and retrace periods, respectively, to increase the efficiency.

The present invention also provides a vertical deflection circuit having an output stage of the single-ended push-pull amplifier type which employs a switch device for switching a first power source voltage supplied to the output stage in a trace period to a second power source voltage having larger absolute value than the first power source voltage in a retrace period.

Other features, objects and advantages of the present invention will be apparent from the following description taken in conjunction with the accompanying drawings.

DESCRIPTION OF THE PREFERRED EMBODIMENTS

For the sake of better understanding the present invention, an example of the prior art will be described first with reference to FIGS. 1 and 2A to 2C.

Figure 1:
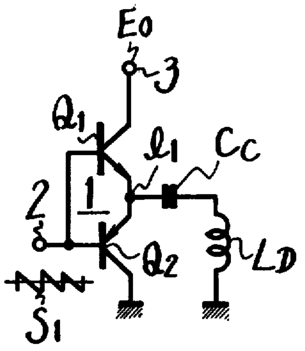
FIG. 1 (PRIOR ART)
FIG. 1 is a schematic circuit diagram showing a prior air circuit for vertical deflection employing an output stage of single-ended push-pull amplifier type.

FIG. 1 shows a part of a prior art vertical deflection circuit employing an output stage of single-ended push-pull type. In the figure, reference numeral 1 indicates a single-ended push-pull amplifier type circuit of a vertical deflection circuit. A pair of transistors $Q_1$ and $Q_2$ form the output stage. A common input terminal 2 of both transistors $Q_1$ and $Q_2$ is supplied with a driving signal $S_1$ of sawtooth waveform, which is in synchronism with the vertical period, to switch the transistors $Q_1$ and $Q_2$. Thus, as is well known, a sawtooth waveform signal (current) is produced and supplied to a deflection coil $L_D$ which is connected through a capacitor $C_c$ to the common connection point $1_1$ of the transistors $Q_1$ and $Q_2$.

Figures 2A, 2B, 2C:
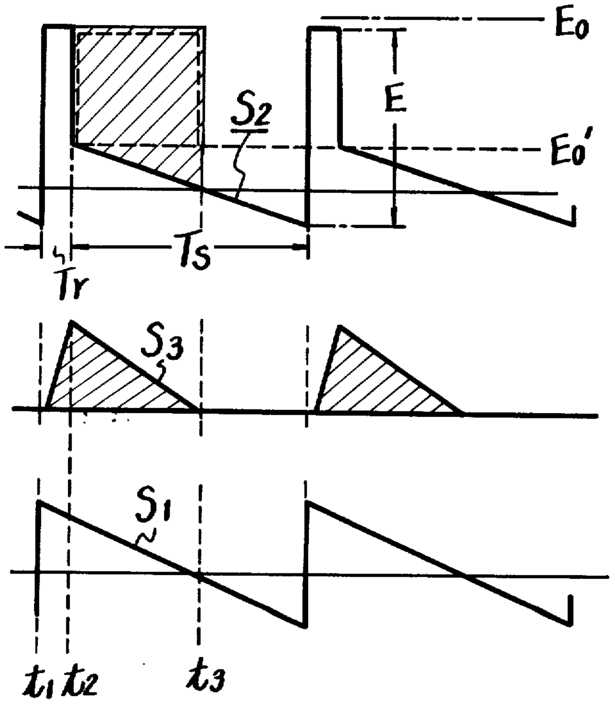
FIGS. 2A to 2C are schematic waveform diagrams used for explanation of the prior art circuit shown in FIG. 1.

With such a circuit arrangement of the prior art vertical deflection circuit and with consideration given to the emitter voltage at the connection point $1_1$, a voltage waveform $S_2$ is obtained at every single field interval, which waveform is a pulse like shape during the retrace period $T_r$ but changes linear during the trace period $T_s$, as shown in FIG. 2A. In this case, the maximum output signal voltage E obtained at the emitter of the transistor $Q_1$ is lower than power source voltage $E_0$ due to the circuit construction, for example, the saturation voltage drop of the transistor $Q_1$ and the like. Since the base of the transistor $Q_1$ is supplied with the sawtooth waveform driving signal $S_1$ shown in FIG. 2C, the transistor $Q_1$ is made conductive during the time interval between times $t_1$ and $t_3$. Accordingly, if the power consumption in the tansistor $Q_1$ is taken into account, its voltage component is a trapezoid portion shown with cross-hatching in FIG. 2A. While, the current flowing through the transistor $Q_1$ at this time is approximately $\beta$ times of the driving signal $S_1$, $\beta$ being the current-amplification factor or gain of the transistor $Q_1$, so that the current component of power consumed in the transistor $Q_1$ becomes a current $S_3$ with a waveform almost similar to that of the driving signal $S_1$ as shown in FIG. 2B by the crosshatching. As a result, the power P consumed in the transistor $Q_1$ becomes a product of the voltage value with the cross-hatching in FIG. 2A and the current value with the cross-hatching in FIG. 2B.

From the operational point of view, the transistor $Q_1$ is made conductive during the time interval between the times $t_1$ and $t_3$ as shown in FIGS. 2A to 2C. However, the voltage portion shown with the cross-hatching in FIG. 2A, especially, surrounded by dotted lines between voltages $E_0$ and $E_0'$ in FIG. 2A is not delivered to the emitter of the transistor $Q_1$, but applied across the collector-emitter thereof, and namely is a useless voltage. Accordingly, the power consumption caused by this voltage in the transistor $Q_1$ is a useless one and hence lowers the output efficiency of the vertical deflection circuit.

As described above, the prior art vertical deflection circuit has the drawback that its output efficiency is relatively poor.

As mentioned previously, the present invention has as its object to avoid the drawback of the prior art and to provide a vertical deflection circuit which is high in output efficiency and and small in useless power consumption.

If a power or voltage source corresponding to the voltage source of the prior art described in connection with FIG. 1 is taken as a first voltage source, the main feature of the present invention resides in the provision a second voltage source with a voltage value having a larger absolute value than that of the first voltage source to drive the vertical deflection circuit with the first voltage source during the trace period $T_s$, but with the second voltage source during the retrace period $T_r$. In this case, the switching between the voltage sources is performed by a semiconductor switching device such as a silicon controlled rectifier (SCR), a gate controlled switch (GCS) or the like.

Figure 3:
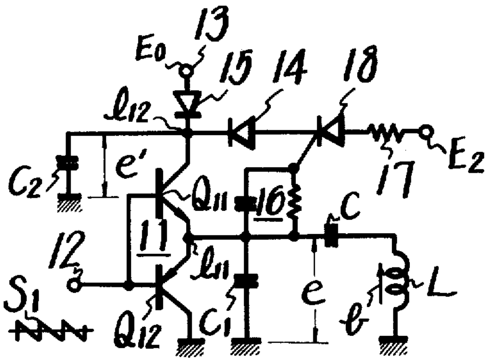
FIG. 3 is a schematic circuit diagram showing one embodiment of the vertical deflection circuit according to the present invention.

One embodiment of the vertical deflection circuit according to the present invention will be now described with reference to FIG. 3. In the embodiment of FIG. 3, as the semiconductor switching device a GCS is used. The output stage of the circuit is constructed by a pair of transistors $Q_{11}$ and $Q_{12}$ connected as a single-ended push-pull amplifier type. An input terminal 12, which is common to the bases of the transistors $Q_{11}$ and $Q_{12}$, is supplied with a driving signal $S_1$ of sawtooth wave form. A deflection coil or yoke L is connected through a capacitor C to a connection point $1_{11}$ between the emitters of the two transistors $Q_{11}$ and $Q_{12}$. A GCS 18 is provided such that its anode is connected to a second voltage source having the voltage of $E_2$ which is higher than a first voltage source with the voltage of $E_0$. Its cathode is connected through a diode 14 to the first voltage source $E_0$. A diode 15 is inserted between the first voltage source $E_0$ and the diode 14, both diodes being poled forwardly. The gate of GCS 18 is connected through a differentiation circuit 16 to the connection point $1_{11}$ to which one electrode of a capacitor $C_1$ is connected, the other electrode of the capacitor $C_1$ being grounded. A capacitor $C_2$ is inserted between the ground and a connection point $1_{12}$ of the diodes 14 and 15.

Figures 4A, 4B, 4C, 4D, 4E, 4F:
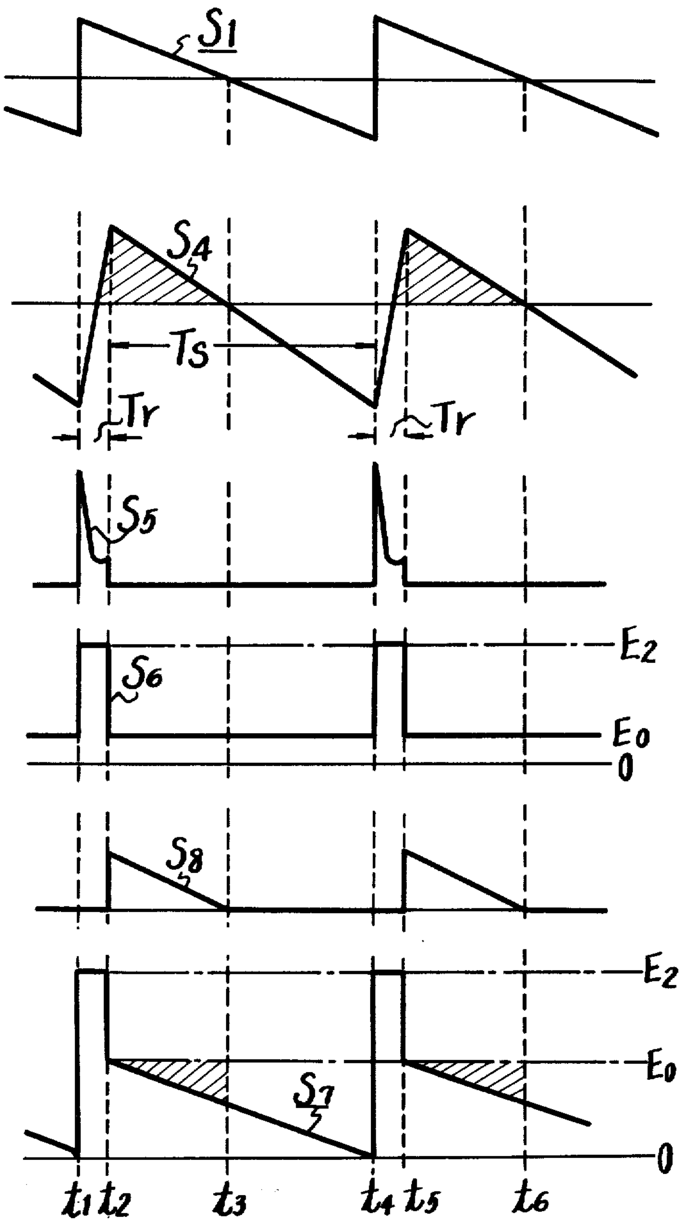
FIGS. 4A to 4F are schematic waveform diagrams used for explanation of the vertical deflection circuit of the present invention as shown in FIG. 3.

The operation of the embodiment shown in FIG. 3 will be now described with reference to FIGS. 4A to 4F. The input terminal 12 is supplied with the driving signal $S_1$ which rises up abruptly as shown in FIG. 4A, hereinbefore described. For convenience, a condition at a time $t_1$ is shown in FIG. 4 as the time at which the GCS 18 is made nonconductive, and will be taken as the start of description. Since the transistor $Q_{11}$ is made conductive by the driving signal $S_1$ at a time $t_2$, a deflection current $S_4$ shown in FIG. 4B flows through the deflection yoke L. In this case, however, the driving signal $S_1$ which is applied to the transistor $Q_{11}$ decreases as time elapses, so that the deflection current $S_4$ also decreases with time. At this time, the capacitor C is charged up by the deflection current $S_4$ to produce a voltage difference across the capacitor C. At a time $t_3$ when the transistor $Q_{11}$ is made nonconductive, the deflection current $S_4$ becomes zero and the transistor $Q_{12}$ is in turn made conductive by the driving signal $S_1$. As a result, the charge stored in the capacitor C is discharged through the transistor $Q_{12}$ and hence through the deflection yoke L a current flows in the negative direction such that it becomes great with time. At a time $t_4$, the transistor $Q_{12}$ is made nonconductive and the transistor $Q_{11}$ is made conductive again by the driving signal $S_1$ which tends to cause its emitter current to flow. At this time, however, through the deflection yoke L a negative current (refer to an arrow *b* in FIG. 3) flows, so that the transistor $Q_{11}$ is biased reversely. Thus, the current from the deflection yoke L flows to charge the capacitor $C_1$. In this case, the coupling capacitor C is neglected because its capacity is large enough. As a result, the terminal voltage *e* across the capacitor $C_1$ increases instantaneously to produce a pulse voltage, which is the retrace pulse. The pulse width of the retrace pulse is determined by a resonant circuit consisting of the capacitor $C_1$, the capacitor $C_2$, which may become substantially parallel to the former later, and the deflection yoke or coil L, and therefore the retrace period $T_r$ is determined. The terminal voltage *e* is applied through the differentiation circuit 16 to the gate of the GCS 18 as a turn-on signal at the time $t_4$ and the GCS 18 is made conductive at the time $t_4$, since the terminal voltage *e* becomes greater by several times than the voltage $e'$ across the capacitor $C_2$ which is charged through the diode 15 and consequently, the potential of the gate becomes higher than the potential of the cathode. An anode current $S_5$ of the GCS 18 becomes a current waveform as shown in FIG. 4C. The capacitor $C_2$ is charged with the time constant determined by its capacity and the resistance value of a resistor 17 connected to the anode of the GCS 18 and the voltage $e'$ across the capacitor $C_2$ increases to that of the second voltage source $E_2$, as shown in FIG. 4D. In this case, its waveform is shown by a curve $S_6$ in FIG. 4D.

At a time, elapsed somewhat from the time $t_4$, the transistor $Q_{11}$ is put in a saturated state by the driving signal $S_1$, so that its emitter voltage, namely, the retrace pulse can increase abruptly to the voltage $E_2$ of the second voltage source shown as a voltage of the retrace period between the times $t_1$ and $t_2$ in FIG. 2F. In this case, since the anode current $S_5$ of GCS 18 flows through the transistor $Q_{11}$ as a part of the current during the retrace period $T_r$ due to turning-on of the transistor $Q_{11}$, the anode current $S_5$ of GCS 18 comes to have a waveform as shown in FIG. 4C. Immediately before a time $t_5$ where the retrace period $T_r$ is terminated, the transistor $Q_{11}$ is kept in a saturated state and its emitter voltage is high. However, when the time over the time $t_5$ elapses slightly, the emitter voltage of the transistor $Q_{11}$ is lowered and its emitter current is lowered gradually with the result that the voltage at its collector becomes high as compared with that at its emitter. Thus, the gate-cathode of GCS 18 is biased reversely and hence the GCS 18 is turned off. At this time, the terminal voltage $e'$ of the capacitor $C_2$ is lowered to be the voltage $E_0$ of the first voltage source. That is, the GCS 18 is turned ON by the voltage *e* across the yoke L during the retrace period $T_r$ only, but turned OFF when the trace period $T_s$ arrives.

When the GCS 18 is turned OFF, the transistor $Q_{11}$ is supplied with the voltage $E_0$ of the first voltage source and its emitter voltage becomes the voltage drop caused by the voltage waveform as shown in FIG. 4F which is gradually lowered due to the current flowing through the deflection yoke L and by the resistance of the deflection yoke L during the trace period between times $t_2$ and $t_3$. That is to say, an output voltage appears at the emitter of the transistor $Q_{11}$ which becomes a voltage $S_7$, shown in FIG. 4F. In FIG. 4E, a curve $S_8$ shows a current waveform which flows through the diode 15 when the GCS 18 is turned off and when the GCS 18 is turned ON, no current flows through the diode 15 due to the fact that the diode 15 is biased reversely at that time.

As may be apparent from the operation described above, the output stage consisting of transistors $Q_{11}$ and $Q_{12}$ is supplied with the voltage $E_2$ of the second voltage source during the retrace period $T_r$ but with the voltage $E_0$ of the first voltage source as a driving voltage during the trace period $T_s$ as an operation voltage.

The output efficiency of the circuit according to the present invention is now taken in account. In consideration of the power consumed in the transistor $Q_{11}$, the voltage component of the consumed power in the transistor $Q_{11}$ during the trace period $T_s$ is only the triangular portion shown by the cross-hatching in FIG. 4F, that is, a portion surrounded by the voltage curves $S_7$ and $E_0$ between times $t_2$ and $t_3$. This portion corresponds to the triangular portion surrounded by the voltage curves $S_2$ and $E_0'$ in FIG. 2A of the prior art. Accordingly, it will be easily understood that the power consumed in the transistor $Q_{11}$, which is the product of the current component shown by the triangular portion shown by the cross-hatching in FIG. 4B which corresponds to the triangular portion shown with the cross-hatching in FIG. 2B and the triangular portion shown with the cross-hatching in FIG. 4F, is reduced considerably as compared with that of the prior art. In other words, with the present invention, the useless power consumption caused by the useless voltage in correspondence with the part surrounded by the dotted lines in FIG. 2A of the prior art is avoided. In the present invention, since the power supply from the second voltage source with the voltage $E_2$ can be neglected, the power supplied from the voltage source to the circuit is substantially the same as that of the prior art and as a result, the output efficiency is much enhanced.

As will be apparent from the above description, with the present invention, the GCS 18 is used and controlled to apply the second voltage $E_2$ to the output stage only during the retrace period $T_r$, so that the output efficiency is increased and hence an input power such as one-half to one-fourth of that of the prior art is sufficient. Further, the power consumption is reduced and the retrace period $T_r$ $$= \left| 1L \frac{I_{p-p}}{ep} \right|$$

where $ep$ represents the terminal voltage of the deflection yoke $L$, $I_{p-p}$ the peak value of the deflection current through the yoke $L$, and $1L$ an inductance of the yoke $L$, can be shortened, so that the performance of the invention is made relatively high. In connection therewith, the collector loss of the transistors $Q_{11}$ and $Q_{12}$ of the single-ended push-pull circuit 11 is also lowered and hence the circuit according to the present invention is free from the necessity of expensive transistors and other additional components.

Figure 5:
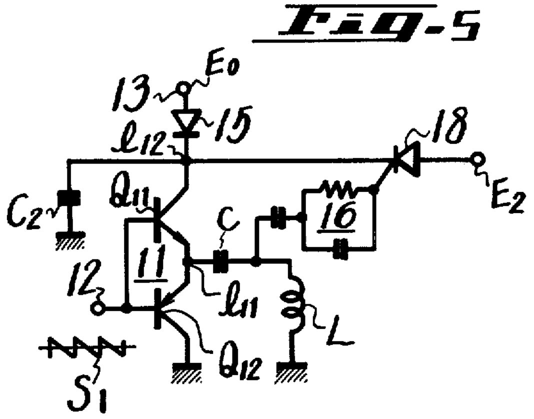
FIGS. 5 and 6 are schematic circuit diagrams showing other embodiments of the vertical deflection circuit of the present invention.

Another embodiment of the invention will be now described with reference to FIG. 5 which is the same as that of FIG. 3 except that the diode 14 and the capacitor $C_1$ used in FIG. 3 are dispensed with. With the embodiment of FIG. 5, the current flowing through the deflection yoke $L$ charges a stray capacitor which exists substantially in parallel thereto to increase the terminal voltage of the deflection yoke $L$ during the retrace period $T_r$ and to make the GCS 18 conductive so that the same effect as that of the first embodiment can be obtained.

Figure 6:
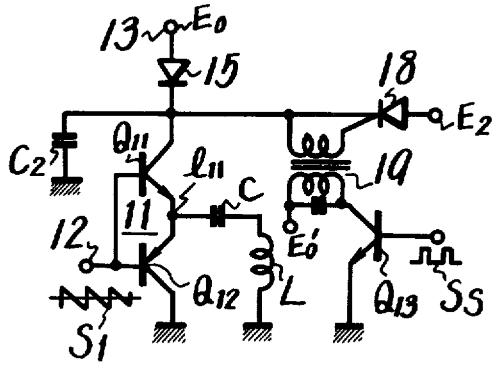

FIG. 6 shows a further embodiment of this invention in which, instead of using the pulse generated across the deflection yoke $L$ so as to control the ON-OFF state of the GCS 18, a transistor $Q_{13}$ is supplied with a switching signal $S_s$ related to the trace and retrace periods, and the output signal from the transistor $Q_{13}$ is applied through a transformer 19 to the gate of the GCS 18. In such an arrangement, the GCS has its conductivity controlled by controlling the ON and OFF states of the transistor $Q_{13}$.

In place of the GCS 18 used in FIG. 3, a SCR may be used. In such a case, if the time constant determined by the capacitor $C_2$ and the resistor 17 is selected as approximately one-half of the trace period $T_r$, the SCR is made nonconductive when the charging current of the capacitor $C_2$ flowing through the SCR becomes lower than the current for holding the SCR in the ON-state, and with such an operation the SCR can be used in place of the GCS 18 in FIG. 3.

It will be apparent that the scope of the present invention is not restricted to the embodiments described above. By way of example, the first and second voltage sources supply the voltages $E_0$ and $E_2$ of positive value, respectively, in the foregoing embodiments, but they can be replaced by negative voltage sources, respectively. In such a case, the absolute value of the second voltage $E_2$ would be selected greater than that of the first voltage $E_0$ and the transistors forming the output stage, the switching devices and so on would be connected with polarities such that currents flowing therethrough are reverse to those in the foregoing embodiments.

In any case, it is important that the absolute value of the second voltage is selected greater than that of the first voltage and the output stage is connected to the second voltage source during the retrace periods only.

It may be apparent that many variations and modifications could be effected by those skilled in the art without departing from the spirit and scope of the novel concepts of the present invention. Accordingly, the scope of the invention should be determined by the appended claims only.

I claim as my invention:

1. A deflection circuit comprising:

a. a first voltage terminal provided to be connected to a first voltage source;

b. an output circuit including a pair of transistors connected in a single-ended push-pull amplifier array and a deflection coil connected to the output end of said pair of transistors, means for supplying a sawtooth signal to an input of said push-pull amplifier array, and bias means associated with said push-pull amplifier array to cause said deflection coil to be supplied with a deflection current in trace and retrace periods; said retrace period having a relatively large pulse and said trace period having a ramp shape;

c. a unidirection element connected between said first voltage terminal and one end of said output circuit;

d. a second voltage terminal provided to be connected to a second voltage source which is larger than the first voltage source;

e. gate controlled switch means connected between said second voltage terminal and said one end of the output circuit; and f. control means connected to the output of the pair of transistors and to switch means for turning on the switch means in response to the switching of the output of the pair of transistors to the retrace period current.

2. A deflection circuit according to claim 1, wherein said control means comprises means for supplying a control signal varying in response to the turning of the period point between the trace and retrace periods to said switch means so as to make said switch element nonconductive in the trace period and conductive in the retrace period.

3. A deflection circuit according to claim 2, wherein said control means further comprises means for producing said control signal in response to a pulse obtained at the output end of said pair of transistors.

4. A deflection circuit according to claim 2, wherein said switch means comprises a semiconductor thyristor having a gate and said control means connected to said gate.

5. A deflection circuit according to claim 4, wherein said control means comprises a differentiating circuit connected between said gate of said semiconductor thyristor and the output end of said pair of transistors.

6. A deflection circuit according to claim 5, further comprising an additional unidirectional element connected between said semiconductor thyristor and said one end of the output circuit.

7. A deflection circuit according to claim 1, wherein one end of said pair of transistors is connected to a reference potential and wherein a capacitor is connected to said one end of the output circuit and to said reference potential.

8. A deflection circuit according to claim 7, further comprising an additional capacitor connected in series to said deflection coil.

9. A deflection circuit according to claim 8, further comprising a second additional capacitor connected to the output end of said pair of transistors and to the gate of the switch means.

* * * * *